United States Patent
Jouen et al.

(10) Patent No.: US 6,949,980 B2
(45) Date of Patent: Sep. 27, 2005

(54) PHASE-LOCKED LOOP WITH HIGH FREQUENCY ADJUSTMENT OF THE OPERATING RANGE OF THE OSCILLATOR

(75) Inventors: Philippe Jouen, Claix (FR); Michael Kraemer, Brie et Angonnes (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/675,810

(22) Filed: Sep. 30, 2003

(65) Prior Publication Data

US 2004/0160279 A1 Aug. 19, 2004

Related U.S. Application Data

(63) Continuation of application No. 10/235,902, filed on Sep. 5, 2002, now abandoned.

(30) Foreign Application Priority Data

Sep. 5, 2001 (FR) .............................................. 01/11472

(51) Int. Cl.[7] .......................... H03L 7/085; H03L 7/099; H03L 7/10
(52) U.S. Cl. ........................... 331/17; 331/1 A; 331/14; 331/16; 331/25; 331/36 C; 331/177 V; 331/179
(58) Field of Search ...................... 331/1 A, 14, 16–18, 331/25, 177 V, 179, 36 C, DIG. 2; 327/156–159; 332/127; 360/51; 375/376; 455/260

(56) References Cited

U.S. PATENT DOCUMENTS

| 4,503,401 A | 3/1985 | Kyriakos et al. |
| 4,812,783 A | 3/1989 | Honjo et al. |
| 4,929,917 A * | 5/1990 | Yokogawa et al. .......... 331/1 A |
| 5,648,744 A | 7/1997 | Prakash et al. |
| 5,933,058 A | 8/1999 | Pinto et al. |
| 6,411,144 B1 * | 6/2002 | Matsuno ..................... 327/157 |

FOREIGN PATENT DOCUMENTS

GB 2120478 11/1983

OTHER PUBLICATIONS

French Search Report from corresponding French National Appl. No. 0111472, filed Sep. 5, 2001.

* cited by examiner

*Primary Examiner*—David Mis
(74) *Attorney, Agent, or Firm*—Lisa K. Jorgenson; James H. Morris; Wolf, Greenfield & Sacks, P.C.

(57) ABSTRACT

A phase-locked loop including an oscillator, controlled by a control signal generated by a comparison circuit comparing a reference frequency and the oscillator frequency and filtered by an integrator low-pass filter; a control and adjustment circuit for, with a predetermined frequency smaller than the reference frequency, taking into account the value of the filtered controlled signal and, if this value is out of a range of predetermined values, adjusting the operating range of the oscillator; and an inhibition circuit for deactivating the comparison circuit for a predetermined duration before taking into account the value of the filtered control signal.

41 Claims, 5 Drawing Sheets

PHASE-LOCKED LOOP WITH HIGH FREQUENCY ADJUSTMENT OF THE OPERATING RANGE OF THE OSCILLATOR

RELATED APPLICATIONS

This application is a continuation of U.S. application Ser. No. 10/235,902 entitled Phase-Locked Loop Made In Integrated Circuit Form filed on Sep. 5, 2002 now abandoned, which is herein incorporated by reference in its entirety.

BACKGROUND OF THE INVENTION

1. Field of the Invention

The present invention relates to phase-locked loops, and in particular to a phase-locked loop made in an integrated circuit.

2. Discussion of the Related Art

FIG. 1 schematically shows a phase-locked loop conventionally used in frequency synthesis. The phase-locked loop includes a voltage-controlled oscillator (VCO) 2 generating a periodic output signal of frequency Fout to be synchronized on a reference frequency Fref. A comparison circuit 4 compares a signal with reference frequency Fref and with a frequency signal Fdiv equal to a division of frequency Fout by a predetermined factor N. Comparison circuit 4 provides a control signal to an integrator low-pass filter 6. Filter 6 provides a voltage Vcom for controlling oscillator 2. Frequency Fout varies between minimum and maximum frequencies, in an operating range characteristic of the oscillator, when voltage Vcom varies between minimum and maximum values.

The phase-locked loop is made in an integrated circuit, except for filter 6, as will be seen hereafter. The characteristics of the integrated components may vary along with the manufacturing process. In particular, the operating range of oscillator 2 may vary along with the manufacturing process, which may cause a malfunction of the phase-locked loop. To solve this problem, the operating range of oscillator 2 is adjustable by an adjustment signal FA, generated by a control and adjustment circuit 8. Circuit 8 is provided to control whether the oscillator is in a desired operating range or not. For this purpose, circuit 8 ensures that voltage Vcom of oscillator 2 does not have a value greater than a high threshold value VH, or that it does not have a value smaller than a low threshold value VL. If voltage Vcom is greater than value VH, circuit 8 generates an adjustment signal FA adapted to adjusting the operating range of oscillator 2 upwards. If Vcom is smaller than value VL, circuit 8 generates an adjustment signal FA adapted to adjusting the operating range of oscillator 2 downwards. The taking into account of the value of voltage Vcom by circuit 8 is periodically activated by a clock signal CKaj. Signal CKaj is generated by a frequency divider 9 based on reference frequency Fref.

FIG. 2 schematically shows an implementation of oscillator 2 and adjustment and control circuit 8. Oscillator 2 includes a negative-resistance amplifier 10, the output of which is the oscillator output. The input of amplifier 10 is connected to a first terminal of a capacitor C. The second terminal of capacitor C is connected to the oscillator input via a resistor R. The cathode of a varicap diode Dv is connected to the second terminal of capacitor C. The anode of diode Dv is connected to a ground GND. An inductance L and a variable capacitor Cv are connected in parallel between the input of amplifier 10 and the ground. The capacitance of variable capacitor Cv is controlled by signal FA. As an example (not shown), adjustment signal FA may be a digital signal and capacitor Cv may be formed of a capacitor of predetermined value connectable in parallel with several capacitors by switches, each controlled by one bit of adjustment signal FA. Oscillator 2 has the following operating frequency:

$$Fout = 1/2\pi [L(Cv+Cdv)]^{1/2},$$

where Cdv is the dynamic capacitance of varicap diode Dv, which varies according to control voltage Vcom. The adjusting of the capacitance of capacitor Cv by adjustment signal FA enables adjusting the oscillator operating range. Control and adjustment circuit 8 includes comparators 12 and 14 enabling comparing voltage Vcom with values VH and VL. Comparators 12 and 14 control a coding block 16. Coding block 16 controls via an adder the incrementation or the decrementation of adjustment signal FA, stored in a D flip-flop 18 clocked by clock signal CKaj. The value of voltage Vcom is thus taken into account by circuit 8 at each rising edge of signal CKaj, and causes, if necessary, an immediate adjustment of the operating range.

FIG. 3 illustrates the variations of frequency Fout of the oscillator according to voltage Vcom for different values of adjustment signal FA. For simplicity, the capacitance of variable capacitor Cv is assumed to only be able to take two values, and digital adjustment signal FA is assumed to only take values 0 or 1. In practice, adjustment signal FA may be comprised of several bits and the capacitance of capacitor Cv may take a great number of values. Voltage Vcom varies between a minimum value Vmin and a maximum value Vmax. In the illustrated example, the capacitance of capacitor Cv is maximum when adjustment signal FA is 0. The oscillator then is in a low frequency range. Frequency Fout then linearly varies between a low frequency FL0 when voltage Vcom has a value Vmin and a high frequency FH0 when voltage Vcom has a value Vmax. When adjustment signal FA is 1, the oscillator is in a high frequency range. Frequency Fout then linearly varies between a low frequency FL1 when voltage Vcom has a value Vmin, and a high frequency FH1 when voltage Vcom has a value Vmax. Threshold values VH and VL, which define the voltage range out of which circuit 8 controls an adjustment of the oscillator operating range, are respectively chosen to be slightly smaller than value Vmax and slightly greater than value Vmin. For simplicity, it is considered hereafter that values Vmin and Vmax are substantially equal respectively to ground GND and to value Vdd of the circuit supply voltage.

When the value of voltage Vcom is taken into account by circuit 8, if adjustment signal FA is 0 and if voltage Vcom has a value greater than VH, circuit 8 brings adjustment signal FA from 0 to 1. Similarly, if adjustment signal FA is 1 and if the value of voltage Vcom is smaller than value VL, circuit 8 brings adjustment signal FA from 1 to 0. The operating ranges of the oscillator partially overlap, and oscillator 2 and control and adjustment circuit 8 are chosen so that the median frequency of the upper range substantially corresponds to the high frequency of the lower range. Similarly, the median frequency of the lower range substantially corresponds to the low frequency of the upper range.

FIG. 4 illustrates the variation of frequency Fout of the oscillator according to control voltage Vcom and the variation of voltage Vcom along time in the previously-described phase-locked loop.

It is assumed that, initially, the phase-locked loop is stabilized at a frequency F1 belonging to the lower operating range of the oscillator. Voltage Vcom then has a value V1.

At a time t0, the equilibrium of the phase-locked loop is modified to control a change in output frequency Fout from frequency F1 to a higher frequency F2. The equilibrium of the phase-locked loop is for example modified by increasing the division ratio N determining variable frequency Fdiv. Comparison circuit 4 detects a difference between reference frequency Fref and variable frequency Fdiv, and controls an increase of voltage Vcom. Voltage Vcom is brought from its value V1 to a value V2 corresponding to frequency F2 in the lower operating range of the oscillator. Voltage Vcom varies from value V1 to value V2 in a damped sinusoid. It is assumed, in the illustrated example, that value V2 is greater than threshold value VH.

At a time t1, the value of voltage Vcom is taken into account by control and adjustment circuit 8. Vcom being greater than VH, circuit 8 determines that the oscillator no longer is in the desired operating range, and it brings the oscillator into its upper operating range. Voltage Vcom still is at value V2, and the oscillator then oscillates at a frequency F3 close to maximum frequency FH1 of the oscillator in the upper operating range. The oscillator frequency is then greater than the desired frequency F2. The phase-locked loop then tends to reduce the oscillator frequency. To achieve this, the phase-locked loop brings voltage Vcom from value V2 to a desired value V4, corresponding to frequency F2 in the upper operating range of the oscillator, in a damped sinusoid (shown in dotted lines). Voltage Vcom varies from value V2 to the desired value V4 in a convergence duration Δt, taking intermediary values which may be located out of voltage range VL–VH, although the desired value V4 is in this voltage range. If control and adjustment circuit 8 took into account the value of voltage Vcom at a time when this voltage is outside of range VL–VH, it would, wrongly, determine that the oscillator is in a poorly adapted frequency range. Convergence duration Δt depends on values V2 and V4 and on the characteristics of the phase-locked loop. Conventionally, to avoid for circuit 8 to take into account the intermediary values of voltage Vcom, the period with which the value of voltage Vcom is taken into account is chosen to be greater than the maximum convergence duration Δt of voltage Vcom. In some cases, however, in particular for some embodiments of comparison circuit 4 and of filter 6 of FIG. 1, the convergence duration Δt during which voltage Vcom is likely to take intermediary values located outside voltage range VL–VH may be particularly lengthened.

FIG. 5 illustrates an example of embodiment of a comparison circuit 4 and of an integrator low-pass filter 6 likely to lengthen convergence duration Δt.

Comparison circuit 4 includes a phase/frequency comparator 20 comprised of two D flip-flops respectively clocked at frequencies Fref and Fdiv, having their input terminals connected to a logic level 1. The output terminals of the D flip-flops respectively generate signals UP and DWN. The D flip-flops are reset by a NAND combination of signals UP and DWN. An output terminal A of comparison circuit 4 is connected via a switch 22 to a source 24 of a positive constant current +I. Switch 22 is respectively on or off when signal UP is at 1 or 0. Output terminal A is also connected via a switch 26 to a source 28 of a negative constant current –I. Switch 26 is respectively on or off when signal DWN is equal to 1 or to 0.

Filter 6 includes a capacitor C1 of high value connected in series with a resistor R1 between terminal A and the ground. A capacitor C2 of low value as compared to C1 is also connected between terminal A and the ground. Capacitor C1 plays the function of an integrator of the current provided by circuit 4. Capacitor C2 eliminates the high-frequency components of the current provided by circuit 4.

When a small difference exists between frequencies Fref and Fdiv, comparison circuit 4 provides short current pulses to filter 6. If the current pulses are positive, capacitors C1 and C2 charge at constant current during each pulse. Capacitor C1 charges through resistor R1, while capacitor C2 charges through a negligible parasitic resistance. Between two consecutive pulses, capacitor C2 discharges into capacitor C1 through resistor R1. Similarly, if the current pulses are negative, capacitors C1 and C2 discharge at constant current during each pulse and capacitor C2 charges from capacitor C1 through resistor R1 between two consecutive pulses. The mean value of control voltage Vcom then depends on the difference between reference frequency Fref and variable frequency Fdiv provided by the oscillator, and the phase-locked loop operates normally.

However, when frequencies Fref and Fdiv are very different, comparison circuit 4 provides long current pulses to filter 6. At the beginning of a long current pulse, capacitors C1 and C2 charge (respectively, discharge) at constant current. Capacitor C2 charges (respectively, discharges) rapidly. From the time when capacitor C2 is charged (respectively, discharged), to the end of the current pulse, voltage Vcom is maintained at value Vdd (respectively, GND). Considering that no current is absorbed by oscillator 2, all the current provided by comparison circuit 4 then flows through resistor R1. The voltage drop in resistor R1, of high value, then is on the order of Vdd and capacitor C1 is charged (respectively, discharged) with a reduced current. Further, the duration separating the consecutive current pulses may be too short for capacitor C2 to have time to completely discharge (respectively, to completely charge) into capacitor C1 between two consecutive current pulses. Voltage Vcom is then maintained at a value close to Vdd (respectively, to GND).

FIG. 4 illustrates (in full line) the variation of frequency Fout according to voltage Vcom and the variation of voltage Vcom along time in a phase-locked loop comprised of comparison circuit 4 and of filter 6 of FIG. 5. Until time t1, voltage Vcom varies as previously described. It is assumed that at time t1, the difference between frequencies F3 and F2 is sufficiently large for voltage Vcom to be rapidly brought to a value close to ground GND and smaller than value VL. The oscillator then oscillates at a frequency close to minimum frequency FL1 of the upper operating range. The saturation of comparison filter 4 and of filter 6 is such that voltage Vcom keeps a value close to GND until a time t2 when the value of voltage Vcom is taken into account by circuit 8.

At time t2, circuit 8 erroneously determines that the oscillator no longer is in the desired operating range and it brings the oscillator into its lower operating range. Voltage Vcom still is grounded and the oscillator then oscillates at a frequency close to minimum frequency FL0 of the lower operating range. This frequency being much lower than frequency F2, voltage Vcom is rapidly brought to a value close to value Vdd and greater than value VH. Comparison circuit 4 and filter 6 are saturated in such a way that voltage Vcom is maintained at value Vdd until a time t3 at which voltage Vcom is taken into account again by circuit 8.

At time t3, circuit 8 brings the oscillator back into its upper operating range. The phase locked-loop behaves from time t3 as from time t1, and it cannot stabilize.

As seen previously, a solution to prevent such an oscillation of the phase-locked loop is to decrease the frequency with which the value of voltage Vcom is taken into account by control and adjustment circuit 8. The value of voltage Vcom is then always taken into account after the phase-locked loop is stabilized. However, such a solution reduces the frequency with which the oscillator frequency range can be adjusted, even when comparison circuit 4 and filter 6 are not saturated, which is not desirable.

SUMMARY OF THE INVENTION

An object of the present invention is to provide a phase-locked loop made in the form of an integrated circuit, which keeps a high frequency of adjustment of the operating range of the oscillator.

Another object of the present invention is to provide such a phase-locked loop which is simple and inexpensive to implement.

To achieve these and other objects, the present invention provides a phase-locked loop including:

an oscillator, controlled by a control signal generated by a comparison circuit comparing a reference frequency and the oscillator frequency and filtered by an integrator low-pass filter;

a control and adjustment circuit for, with a predetermined frequency smaller than the reference frequency, taking into account the value of the filtered controlled signal and, if this value is out of a range of predetermined values, adjusting the operating range of the oscillator; and an inhibition circuit for deactivating the comparison circuit for a predetermined duration before taking into account the value of the filtered control signal.

According to an embodiment of the present invention, the inhibition circuit is only activated if the value of the filtered control signal is out of the range of predetermined values.

According to an embodiment of the present invention, the oscillator, the comparison circuit, the control and adjustment circuit, and the inhibition circuit are made in the form of an integrated circuit.

According to an embodiment of the present invention, the filter includes a first capacitor connected in series with a first resistor between an input/output terminal and a ground, a second capacitor, of small value as compared to the first capacitor being connected between the input/output terminal and the ground.

According to an embodiment of the present invention, the comparison circuit includes first and second D flip-flops respectively rated at the reference frequency and at a variable frequency equal to a predetermined ratio of the oscillator frequency, the input terminals of the D flip-flops being connected to 1, the output terminal of the first flip-flop generating an incrementation signal, the output terminal of the second flip-flop generating a decrementation signal, a reset terminal of the D flip-flops being activable by a NAND combination of the incrementation and decrementation signals, the output terminal of the comparison circuit being connected via a first switch to a source of a positive constant current, the first switch being respectively on or off when the incrementation signal is at 1 or 0, the output terminal of the comparison circuit being further connected via a second switch to a source of a negative constant current, the second switch being respectively on or off when the decrementation signal is at 1 or at 0.

According to an embodiment of the present invention, the oscillator includes an amplifier with a negative resistance, the output of which is the oscillator output, the input of the amplifier being connected to a first terminal of a third capacitor, the second terminal of the third capacitor being connected to the oscillator input via a second resistor, a varicap diode being connected by its cathode to the second terminal of the third capacitor, the anode of the varicap diode being connected to ground, an inductance and a variable capacitor being connected in parallel between the input of the amplifier and the ground, the capacitance of the variable capacitor being controlled by an adjustment signal.

According to an embodiment of the present invention, the control and adjustment circuit includes a first comparator enabling comparison of the filtered control signal with a high predetermined voltage, a second comparator enabling comparison of the filtered control signal with a low predetermined voltage, the first and second comparators controlling a coding block which controls via an adder the incrementation or the decrementation of the adjustment signal, stored in a third D flip-flop clocked at said predetermined frequency by a clock signal.

According to an embodiment of the present invention, the inhibition circuit includes a fourth D flip-flop generating an inhibition signal, the fourth flip-flop being clocked by the inverse of the clock signal and reset by the high state of the clock signal, the input terminal of the fourth D flip-flop receiving a signal equal to 1 when the control signal is greater than the high predetermined voltage or smaller than the low predetermined voltage, and equal to 0 otherwise, and two AND gates arranged to cancel the incrementation and decrementation signals respectively provided by the first and second D flip-flops to the first and second switches when the inhibition signal is equal to 1.

The present invention also provides a method for controlling a phase-locked loop including an oscillator controlled by a control signal generated by a comparison circuit comparing a reference frequency with the oscillator frequency and filtered by an integrator low-pass filter, including the steps of:

taking into account the value of the filtered control signal with a predetermined frequency smaller than the reference frequency and adjusting the operating range of the oscillator if the value of the filtered control signal is out of a range of predetermined values; and deactivating the comparison circuit in a predetermined duration before taking into account the value of the filtered control signal.

The foregoing objects, features and advantages of the present invention will be discussed in detail in the following non-limiting description of specific embodiments in connection with the accompanying drawings.

DETAILED DESCRIPTION

According to the present invention, control and adjustment circuit 8 takes into account, not, as conventional, the value of voltage Vcom, but a value substantially equal to the voltage across capacitor C1. Capacitor C1 has a function of integration of the control current provided by circuit 4, and the voltage across capacitor C1 reaches the value of control voltage Vcom when voltage Vcom has reached its desired value. Conventionally, filter 6 is formed by means of discrete components, and a single terminal of capacitor C1, connected to ground, is accessible from the integrated circuit containing the phase-locked loop. To avoid connecting the second terminal of capacitor C1 to an additional input of the integrated circuit, the present invention provides inhibiting the operation of comparison circuit 4, to substantially cancel all the current flowing through resistor R1. Voltage Vcom then takes a value close to voltage VC1 of the second terminal of capacitor C1.

Figure 4:
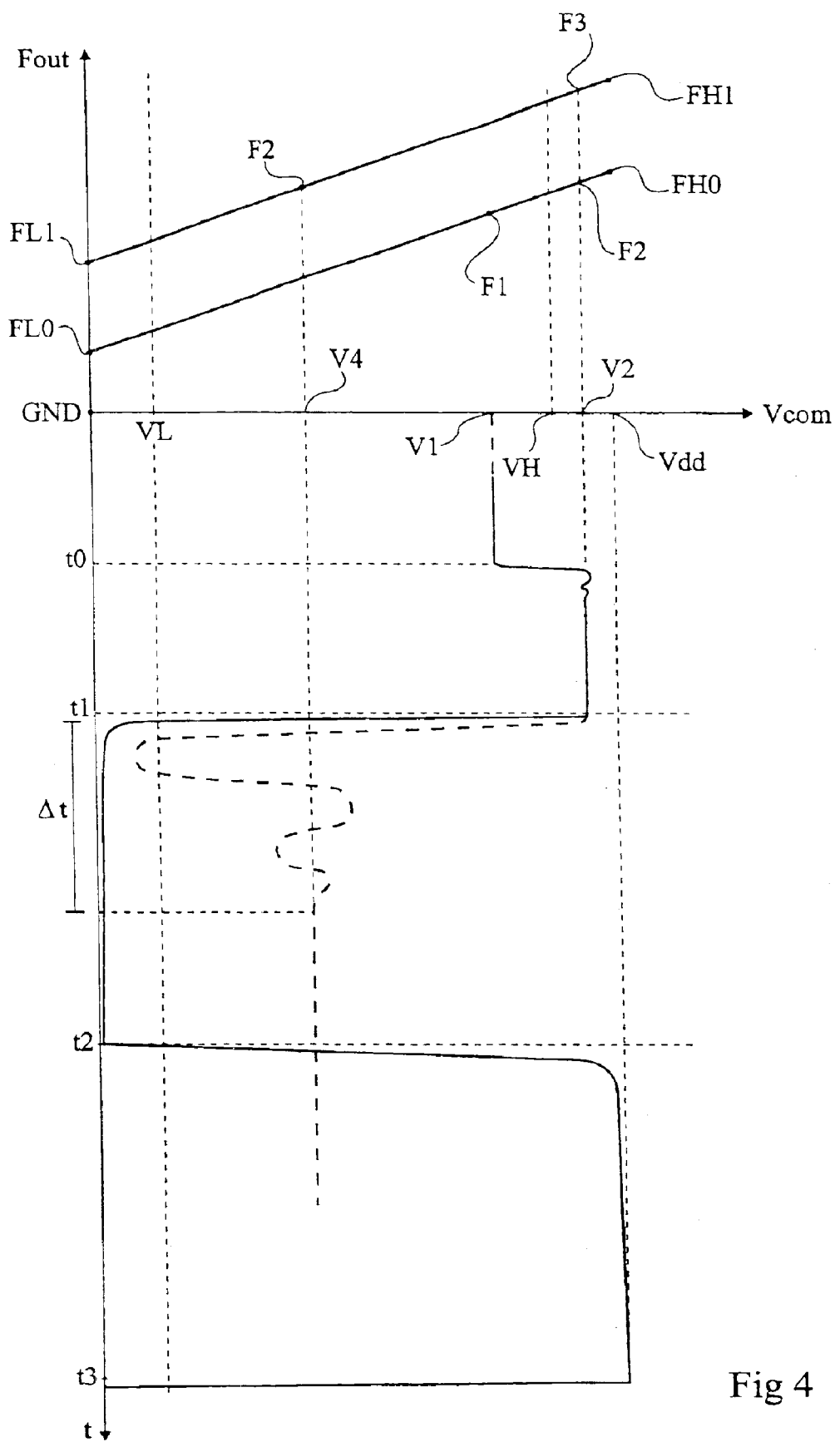
FIG. 4, previously described, illustrates the operation of the phase-locked loop of FIG. 1.
Figure 6:
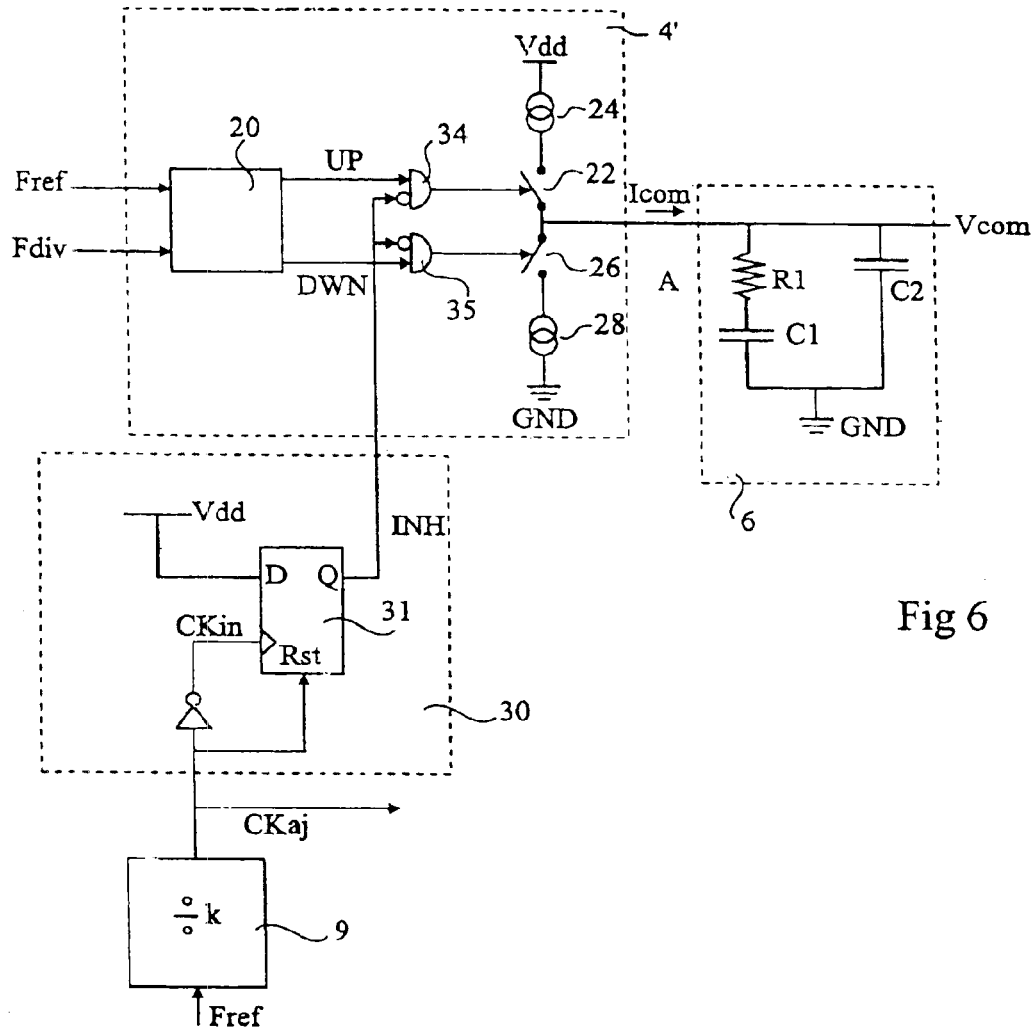
FIG. 6 schematically shows a first embodiment of an inhibition circuit of a phase-locked loop according to the present invention.

FIG. 6 schematically shows a comparison circuit 4', a filter 6, and a frequency divider 9 of a phase-locked loop including, according to the present invention, a first embodiment of a circuit 30 for inhibiting comparison circuit 4'. For clarity, only those elements necessary to the understanding of the present invention have been shown. Circuit 30 includes a D flip-flop 31 clocked by the inverse of clock signal CKaj, and reset by clock signal CKaj. The input terminal of flip-flop 31 is connected to voltage Vdd, so that it permanently has a logic value equal to 1. The output terminal of flip-flop 31 generates an inhibition signal INH. Comparison circuit 4' includes in addition to the elements described in relation with FIG. 4, AND gates 34 and 35 controlled by the inverse of inhibition signal INH, respectively arranged to cancel signals UP and DWN when signal INH has a value 1.

Inhibition circuit 30 and signal CKaj are provided to inhibit comparison circuit 4' and to cancel any current provided by comparison circuit 4' to filter 6 for a given duration, called the inhibition duration, before the value of voltage Vcom is taken into account by circuit 8. Clock signal CKaj is at 0 for the inhibition duration and its switchings to 1 correspond to times when the value of voltage Vcom is desired to be taken into account. When circuit 4' is inhibited, and no positive (respectively negative) current is provided to the filter, capacitor C2 discharges (respectively, charges) into capacitor C1 through resistor R1. The value of voltage Vcom then comes closer to the value of voltage VC1. According to the present invention, the time during which clock signal CKaj is at 0 must be sufficient for voltage Vcom to have time to substantially reach the value of voltage VC1. However, when comparison circuit 4 is inhibited, the phase-locked loop is open and it cannot converge. The time during which signal CKaj is at 0 is thus limited to reduce the time during which the phase-locked loop is open.

Figure 7:
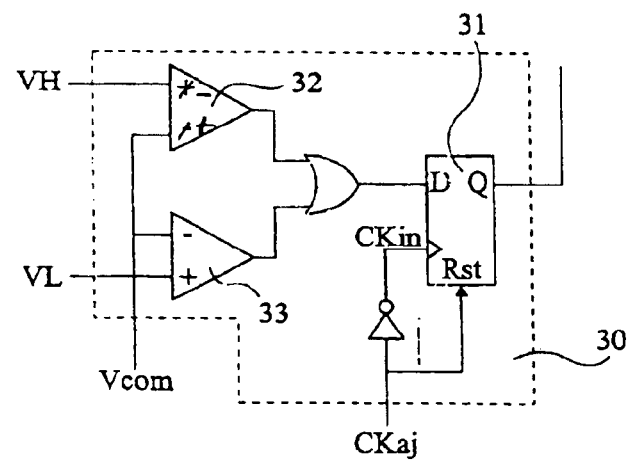
FIG. 7 schematically shows a second embodiment of an inhibition circuit of a phase-locked loop according to the present invention.

FIG. 7 schematically shows a second embodiment of an inhibition circuit 30 according to the present invention. In addition to previously-described flip-flop 31, circuit 30 includes a comparator 32 comparing value VH and the value of voltage Vcom. Circuit 30 also includes a comparator 33 comparing value VL and the value of voltage Vcom. The input terminal of flip-flop 31 receives an OR combination of the outputs of comparators 32 and 33. According to this embodiment, circuit 30 only deactivates circuit 4' when signal CKaj is at 0 and when voltage Vcom is out of operating range VL–VH. Such an inhibition circuit 30 then enables limiting the total time during which circuit 4' is deactivated, that is, during which the phase-locked loop remains open.

Figure 8:
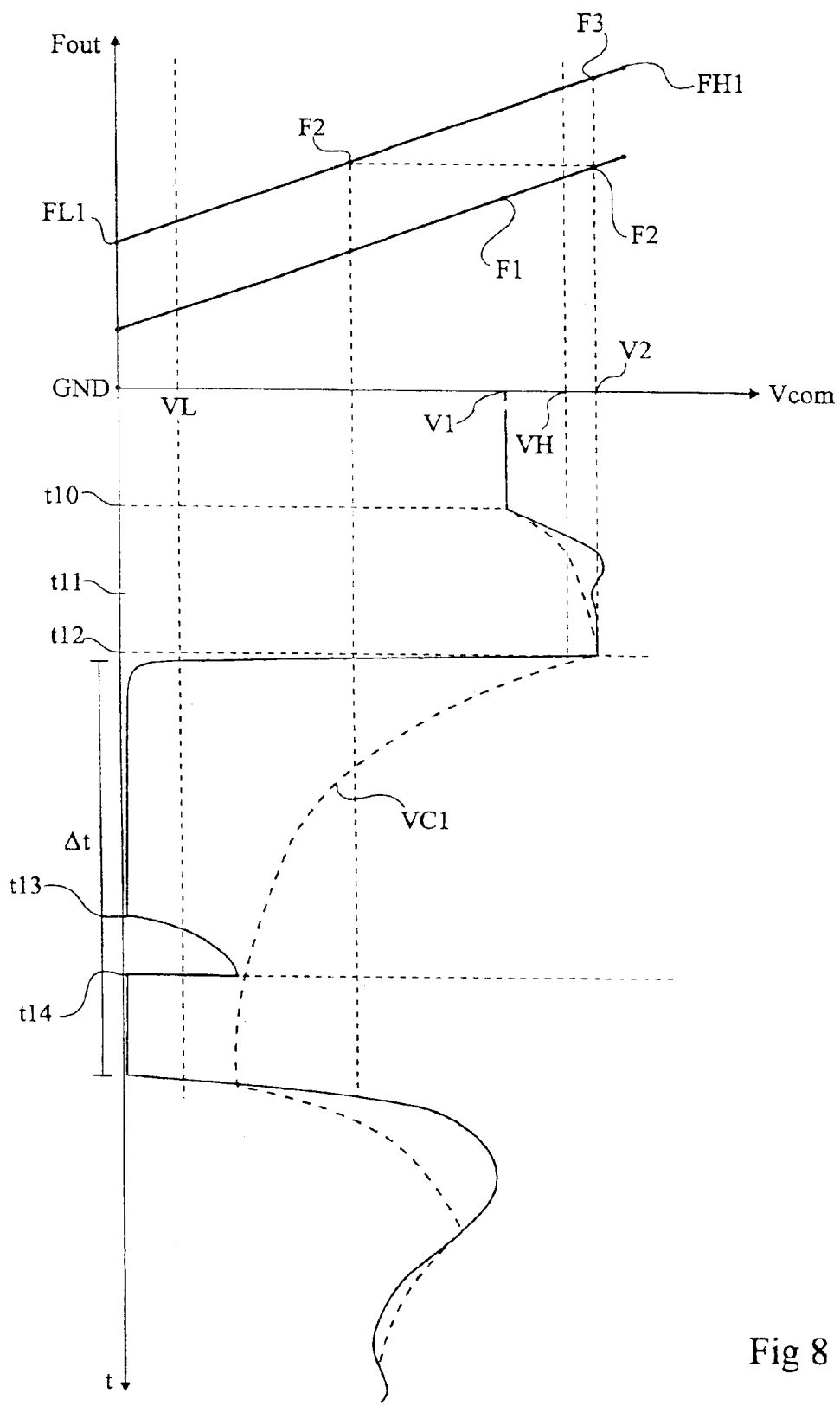
FIG. 8 illustrates the operation of a phase-locked loop according to the present invention.

FIG. 8 illustrates the variation of frequency Fout of the oscillator according to control voltage Vcom, and the variation of voltage Vcom and of voltage VC1 (shown in dotted lines) of the second terminal of capacitor C1 along time, in a phase-locked loop such as described in relation with FIG. 6. The time, frequency, and voltage scales have not been respected, and the aspect of the curves is merely indicative. Reference Vcom represents, in FIG. 8, the mean value of voltage Vcom.

It is assumed that, initially, the phase-locked loop is stabilized at a frequency F1 belonging to the lower operating range of the oscillator. Voltage Vcom then has a value V1. It is assumed that clock signal CKaj (not shown) is at 1.

Figure 1:
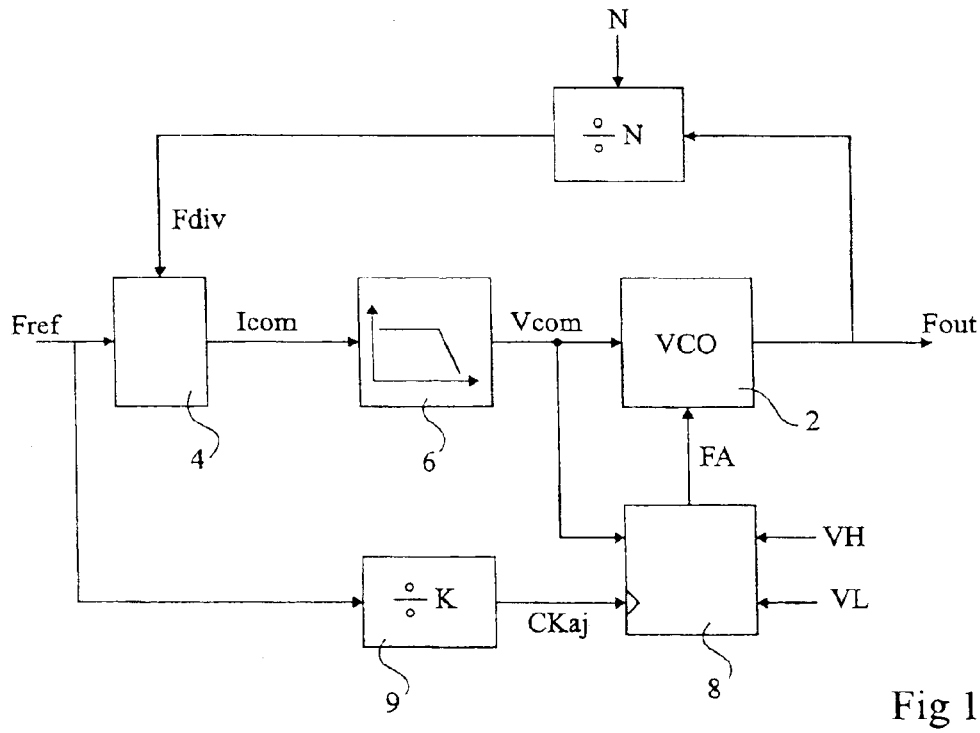
FIG. 1, previously described, schematically shows a conventional phase-locked loop.
Figure 2:
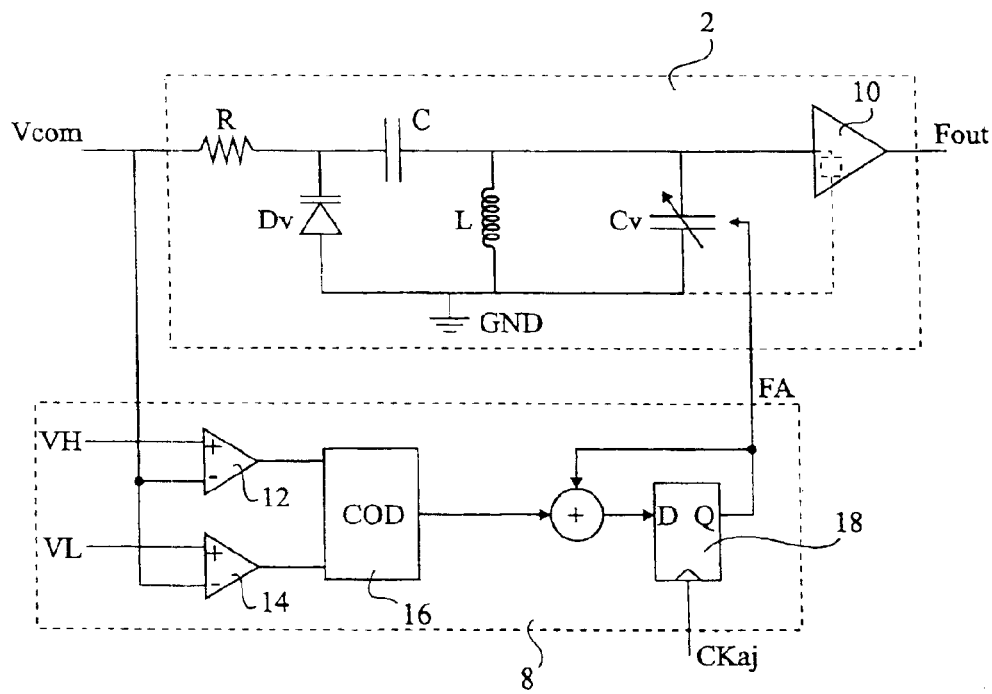
FIG. 2, previously described, schematically shows a conventional adjustable oscillator.
Figure 3:
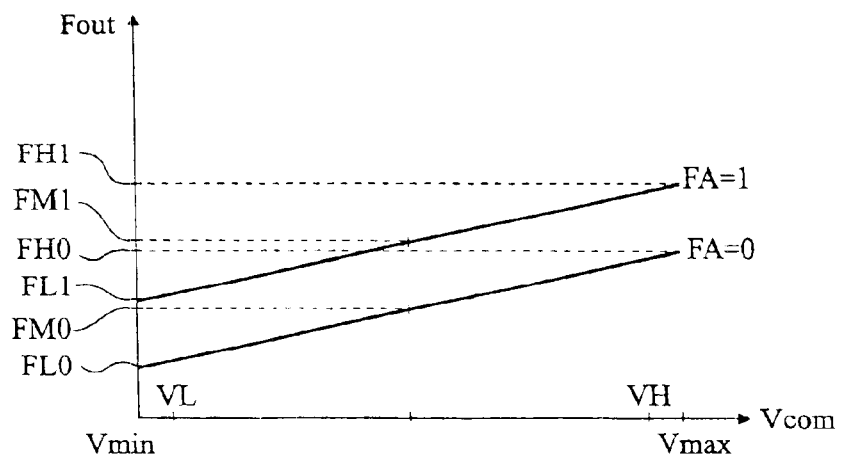
FIG. 3, previously described, illustrates the operation of the oscillator of FIG. 2.
Figure 5:
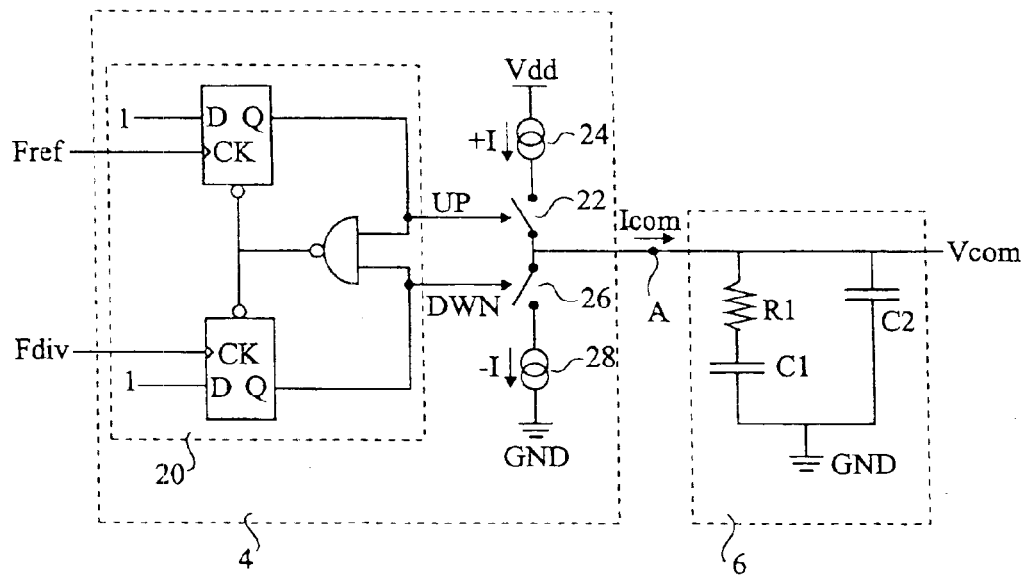
FIG. 5, previously described, schematically shows the comparison circuit and the filter of FIG. 1.

At a time t10, as in FIG. 5, the equilibrium of the phase-locked loop is modified to switch from frequency F1 to a higher frequency F2. As a response, voltage Vcom is brought from its value V1 to a value V2 greater than threshold value VH. Voltage VC1 (shown in dotted lines) reaches value V2 substantially at the same time as voltage Vcom.

At a time t11, clock signal CKaj switches to 0 and comparison circuit 4' is deactivated by inhibition circuit 30. Voltages Vcom and VC1 are substantially equal and voltage Vcom substantially does not vary.

At a time t12, clock signal CKaj switches to 1, and the value of voltage Vcom is taken into account by control and adjustment circuit 8. Voltage Vcom having a value greater than value VH, circuit 8 brings the oscillator into its upper operating range. Voltage Vcom still is at value V2, and the oscillator then oscillates at a frequency F3 close to maximum frequency FH1 of the oscillator in the upper operating range. The phase-locked loop then tends to bring the oscillator from frequency F3 to frequency F2. Comparison circuit 4' and filter 6 are rapidly saturated, and control voltage Vcom is brought to a value close to ground GND, smaller than voltage VL. The oscillator then oscillates at a frequency close to minimum frequency FL1 of the upper operating range. As seen previously, capacitor C1 then discharges with a small current and voltage VC1 slowly draws near voltage Vcom.

At a time t13, clock signal CKaj switches to 0 and comparison circuit 4' is deactivated. Capacitor C2 charges in capacitor C1 through resistor R1 until the value of voltage Vcom is substantially equal to the value of voltage VC1, which is greater than value VL.

At a time t14, clock signal CKaj switches to 1 and the value of voltage Vcom is taken into account by circuit 8. The value of voltage Vcom being included in range VL–VH, circuit 8 does not adjust the operating range of the oscillator. After time t14, comparison circuit 4' is reactivated and the phase-locked loop operates again. The phase-locked loop brings voltage Vcom back to a value close to value GND before bringing it to its expected value V4 in a damped sinusoid.

According to the present invention, even when convergence duration Δt is particularly lengthened, control and adjustment circuit 8 only controls a change in the oscillator operating range if the phase-locked loop is in a steady state and if control voltage Vcom is out of voltage range VL–VH.

The present invention, which is inexpensive and easy to implement, enables achieving this result without reducing the frequency at which control and adjustment circuit 8 takes control voltage Vcom into account, and thus without systematically reducing the speed at which the phase-locked loop can reach its desired operating point.

Of course, the present invention is likely to have various alterations, modifications, and improvements which will readily occur to those skilled in the art. In particular, the present invention has been described in relation with a specific embodiment of a phase-locked loop, but those skilled in the art will easily adapt the present invention to other phase-locked loops having similar characteristics. As an example, the present invention has been described in relation with a digital phase/frequency comparator, but those skilled in the art will readily adapt the present invention to an analog phase/frequency comparator.

The present invention has been described in relation with an oscillator having two operating ranges only, but those skilled in the art will readily adapt the present invention to an oscillator having a greater number of operating ranges.

The present invention has been described in relation with an inhibition circuit which inhibits the phase-locked loop when clock signal CKaj has a zero value, but those skilled in the art will readily adapt the present invention to an inhibition circuit activable by another signal performing a similar function.

The present invention has been described in relation with the case where minimum voltage Vmin and maximum voltage Vmax of the frequency ranges are the ground and the supply voltage, but those skilled in the art will readily adapt the present invention to the case where minimum voltage Vmin and maximum voltage Vmax of the operating ranges are respectively substantially greater than the ground and substantially smaller than the supply voltage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A phase-locked loop including:
   an oscillator, controlled by a control signal generated by a comparison circuit comparing a reference frequency with an oscillator frequency and filtered by an integrator low-pass filter;
   a control and adjustment circuit for, with a predetermined frequency smaller than the reference frequency, taking into account the value of the filtered controlled signal and, if this value is out of a range of predetermined values, adjusting the operating range of the oscillator; and
   an inhibition circuit for deactivating the comparison circuit for a predetermined duration before taking into account the value of the filtered control signal.

2. The phase-locked loop of claim 1, wherein the inhibition circuit is activated only if the value of the filtered control signal is out of the range of predetermined values.

3. The phase-locked loop of claim 1, wherein the oscillator, the comparison circuit, the control and adjustment circuit, and the inhibition circuit are made in an integrated circuit.

4. The phase-locked loop of claim 1, wherein the filter includes a first capacitor connected in series with a first resistor between an input/output terminal and a ground, a second capacitor, of small capacitance as compared to the first capacitor, being connected between the input/output terminal and the ground.

5. The phase-locked loop of claim 1, wherein the comparison circuit includes first and second D flip-flops respectively rated at the reference frequency and at a variable frequency equal to a predetermined ratio of the oscillator frequency, the input terminals of the D flip-flops being connected to 1, the output terminal of the first flip-flop generating an incrementation signal, the output terminal of the second flip-flop generating a decrementation signal, a reset terminal of the D flip-flops being activable by a NAND combination of the incrementation and decrementation signals, the output terminal of the comparison circuit being connected via a first switch to a source of a positive constant current, the first switch being respectively on or off when the incrementation signal is at 1 or 0, the output terminal of the comparison circuit being further connected via a second switch to a source of a negative constant current, the second switch being respectively on or off when the decrementation signal is at 1 or at 0.

6. The phase-locked loop of claim 5, wherein the oscillator includes an amplifier with a negative resistance, the output of which is the oscillator output, the input of the amplifier being connected to a first terminal of a third capacitor, the second terminal of the third capacitor being connected to the oscillator input via a second resistor, a varicap diode being connected by its cathode to the second terminal of the third capacitor, the anode of the varicap diode being connected to ground, an inductance and a variable capacitor being connected in parallel between the input of the amplifier and the ground, the capacitance of the variable capacitor being controlled by an adjustment signal.

7. The phase-locked loop of claim 6, wherein the control and adjustment circuit includes a first comparator enabling comparison of the filtered control signal with a high predetermined voltage, a second comparator enabling comparison of the filtered control signal with a low predetermined voltage, the first and second comparators controlling a coding block which controls via an adder the incrementation or the decrementation of the adjustment signal, stored in a third D flip-flop clocked at said predetermined frequency by a clock signal.

8. The phase-locked loop of claim 7, wherein the inhibition circuit includes a fourth D flip-flop generating an inhibition signal, the fourth flip-flop being clocked by the inverse of the clock signal and reset by the high state of the clock signal, the input terminal of the fourth D flip-flop receiving a signal equal to 1 when the control signal is greater than the high predetermined voltage or smaller than the low predetermined voltage, and equal to 0 otherwise, and two AND gates arranged to cancel the incrementation and decrementation signals respectively provided by the first and second D flip-flops to the first and second switches when the inhibition signal is equal to 1.

9. A method for controlling a phase-locked loop including an oscillator controlled by a control signal generated by a comparison circuit comparing a reference frequency with the oscillator frequency and filtered by an integrator low-pass filter, including the steps of:
   taking into account the value of the filtered control signal with a predetermined frequency smaller than the reference frequency and adjusting the operating range of the oscillator if the value of the filtered control signal is out of a range of predetermined values; and
   deactivating the comparison circuit during a predetermined duration before taking into account the value of the filtered control signal.

10. A phase-locked loop configured to provide an output signal, the phase-locked loop comprising:
   a comparison circuit configured to compare a reference signal and the output signal;
   an inhibition circuit connected to the comparison circuit, wherein the inhibition circuit comprises a D flip-flop configured to output an inhibit signal to the comparison circuit; and
   a frequency divider coupled to the inhibition circuit.

11. The phase-locked loop of claim 10, wherein the phase-locked loop is at least part of an integrated circuit.

12. The phase-locked loop of claim 10, further comprising a low-pass filter configured to filter an output of the comparison circuit.

13. The phase-locked loop of claim 10, wherein the phase-locked loop is capable of operating in a plurality of frequency ranges.

14. The phase-locked loop of claim 13, wherein at least two of the plurality of frequency ranges are overlapping.

15. The phase-locked loop of claim 10, further comprising:
   a voltage controlled oscillator configured to produce the output signal.

16. The phase-locked loop of claim 15, wherein the phase locked loop is capable of operating in a plurality of frequency ranges, the phase-locked loop further comprising:
   a control and adjustment circuit configured to sample an input to the voltage controlled oscillator and adjust an operating frequency range of the phase-locked loop.

17. The phase-locked loop of claim 10, wherein a clock input of the D flip-flop is configured to receive an inverted output from the frequency divider.

18. The phase-locked loop of claim 10, wherein a reset input of the D flip-flop is configured to receive an output of the frequency divider.

19. The phase-locked loop of claim 10, wherein a D input of the D flip-flop is connected to a voltage supply.

20. The phase-locked loop of claim 10, wherein the inhibition circuit is configured to receive a high reference voltage and a low reference voltage.

21. The phase-locked loop of claim 20, wherein the inhibition circuit comprises first comparator having an inverting input configured to receive the high reference voltage.

22. The phase-locked loop of claim 21, wherein the inhibition circuit further comprises a second comparator having a non-inverting input configured to receive the low reference voltage.

23. The phase-locked loop of claim 22, wherein a D input of the D flip-flop is configured to receive a logical combination of an output of the first comparator and an output of the second comparator.

24. The phase-locked loop of claim 23, wherein the logical combination is an OR combination.

25. The phase-locked loop of claim 23, further comprising:
   a voltage controlled oscillator configured to receive a control signal;
   wherein a non-inverting input of the first comparator and an inverting input of the second comparator are configured to receive the control signal.

26. The phase-locked loop of claim 25, wherein the phase-locked loop is at least part of an integrated circuit.

27. A method of operating a phase-locked loop comprising a voltage controlled oscillator controlled by a control signal, the method comprising:
   monitoring a value of the control signal; and
   inhibiting the phase-locked loop if the monitored value of the control signal is outside a predetermined range of values;
   sampling a value of the control signal in addition to monitoring the control signal;
   operating the phase locked loop in a first frequency range; and if the sampled value of the control signal is outside a second predetermined range of values, operating the phase-locked loop in a second frequency range.

28. The method of claim 27, wherein the phase-locked loop is inhibited if the monitored value of the control signal is greater than a first reference value.

29. The method of claim 28, wherein the phase-locked loop is inhibited if the monitored value of the control signal is less than a second reference value.

30. The method of claim 29, wherein the first reference value is greater than the second reference value.

31. The method of claim 27, wherein the phase-locked loop further comprises a comparison circuit to compare an output of the voltage controlled oscillator and a reference signal, and wherein inhibiting the phase-locked loop comprises inhibiting the comparison circuit.

32. The method of claim 27, wherein the predetermined range of values and the second predetermined range of values are the same.

33. The method of claim 27, wherein inhibiting the phase-locked loop comprises opening the phase-locked loop.

34. The method of claim 33, wherein the phase-locked loop further comprises a comparison circuit to compare an output of the voltage controlled oscillator and a reference signal, and wherein opening the phase-locked loop comprises inhibiting the comparison circuit.

35. A method of operating a phase-locked loop comprising a voltage controlled oscillator controlled by a control signal, the method comprising:
   sampling a value of the control signal; and
   inhibiting the phase-locked loop prior to sampling the value of the control signal;
   operating the phase locked loop in a first frequency range; and
   if the sampled value of the control signal is outside a predetermined range of values, operating the phase-locked loop in a second frequency range.

36. The method of claim 35, wherein the inhibition of the phase-locked loop lasts for a predetermined amount of time.

37. The method of claim 35, wherein the control signal is sampled periodically.

38. The method of claim 37, wherein the inhibition of the phase-locked loop is performed periodically.

39. The method of claim 38, wherein the inhibition of the phase-locked loop and the sampling of the control signal occur at a same frequency.

40. A method of operating a phase-locked loop comprising a voltage controlled oscillator controlled by a control signal, the method comprising:
   sampling a value of the control signal; and
   inhibiting the phase-locked loop prior to sampling the value of the control signal;
   wherein the phase-locked loop further comprises a comparison circuit to compare an output of the voltage controlled oscillator and a reference signal, and wherein inhibiting the phase-locked loop comprises inhibiting the comparison circuit.

41. A method of operating a phase-locked loop comprising a voltage controlled oscillator controlled by a control signal, the method comprising:

sampling a value of the control signal;

inhibiting the phase-locked loop prior to sampling the value of the control signal;

wherein inhibiting the phase-locked loop comprises opening the phase-locked loop; and wherein the phase-locked loop further comprises a comparison circuit to compare an output of the voltage controlled oscillator and a reference signal, and wherein opening the phase-locked loop comprises inhibiting the comparison circuit.

* * * * *

UNITED STATES PATENT AND TRADEMARK OFFICE
CERTIFICATE OF CORRECTION

PATENT NO. : 6,949,980 B2
DATED : September 27, 2005
INVENTOR(S) : Philippe Jouen and Michael Kraemer It is certified that error appears in the above-identified patent and that said Letters Patent is hereby corrected as shown below:

Drawings,
Replace Fig. 7 with Fig. 7 below:

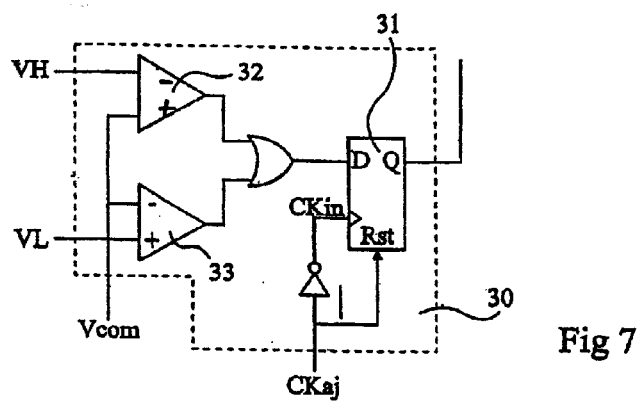

Fig 7

Signed and Sealed this

Fourteenth Day of February, 2006

JON W. DUDAS
*Director of the United States Patent and Trademark Office*